United States Patent
Kellerman et al.

(10) Patent No.: US 7,888,653 B2
(45) Date of Patent: Feb. 15, 2011

(54) TECHNIQUES FOR INDEPENDENTLY CONTROLLING DEFLECTION, DECELERATION AND FOCUS OF AN ION BEAM

(75) Inventors: Peter L. Kellerman, Essex, MA (US); Svetlana Radovanov, Marblehead, MA (US); Frank Sinclair, Quincy, MA (US); Victor M. Benveniste, Lyle, WA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 275 days.

(21) Appl. No.: 12/348,091

(22) Filed: Jan. 2, 2009

(65) Prior Publication Data

US 2010/0171042 A1 Jul. 8, 2010

(51) Int. Cl.
*H01J 3/14* (2006.01)
*H01J 49/22* (2006.01)
*H01J 23/083* (2006.01)

(52) U.S. Cl. .............................. 250/396 R; 250/492.21; 250/423 R; 313/361.1

(58) Field of Classification Search ............. 250/396 R, 250/492.21, 423 R; 313/361.1
See application file for complete search history.

(56) References Cited

U.S. PATENT DOCUMENTS

| | | | |
|---|---|---|---|
| 6,130,436 A | 10/2000 | Renau et al. | |
| 6,326,631 B1 | 12/2001 | Politiek et al. | |
| 6,441,382 B1 | 8/2002 | Huang | |
| 6,489,622 B1 | 12/2002 | Chen et al. | |
| 6,573,517 B1 | 6/2003 | Sugitani et al. | |
| 6,710,358 B1 | 3/2004 | Chen et al. | |
| 6,777,696 B1 * | 8/2004 | Rathmell et al. | 250/492.21 |
| 6,946,667 B2 | 9/2005 | Chen et al. | |
| 6,998,625 B1 | 2/2006 | McKenna et al. | |
| 7,022,984 B1 | 4/2006 | Rathmell et al. | |
| 7,098,614 B2 | 8/2006 | Yamashita | |
| 7,223,973 B2 * | 5/2007 | Kimba et al. | 250/307 |
| 7,521,675 B2 * | 4/2009 | Kawasaki et al. | 250/310 |
| 7,579,602 B2 | 8/2009 | Benveniste et al. | |
| 2006/0108543 A1 | 5/2006 | Chang et al. | |
| 2006/0113494 A1 | 6/2006 | Chen et al. | |

FOREIGN PATENT DOCUMENTS

| | | |
|---|---|---|
| EP | 1691395 A1 | 8/2006 |
| JP | 04 284343 | 10/1992 |

* cited by examiner

*Primary Examiner*—Nikita Wells

(57) ABSTRACT

Techniques for independently controlling deflection, deceleration, and focus of an ion beam are disclosed. In one particular exemplary embodiment, the techniques may be realized as an apparatus for independently controlling deflection, deceleration, and focus of an ion beam. The apparatus may comprise an electrode configuration comprising a set of upper electrodes disposed above an ion beam and a set of lower electrodes disposed below the ion beam. The set of upper electrodes and the set of lower electrodes may be positioned symmetrically about a central ray trajectory of the ion beam. A difference in potentials between the set of upper electrodes and the set of lower electrodes may also be varied along the central ray trajectory to reflect an energy of the ion beam at each point along the central ray trajectory for independently controlling deflection, deceleration, and focus of an ion beam.

28 Claims, 19 Drawing Sheets

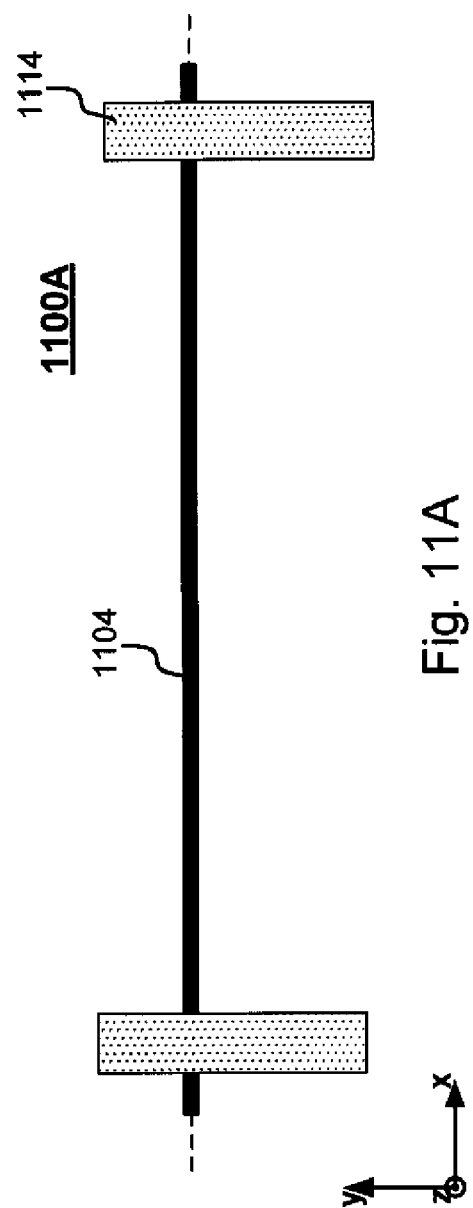
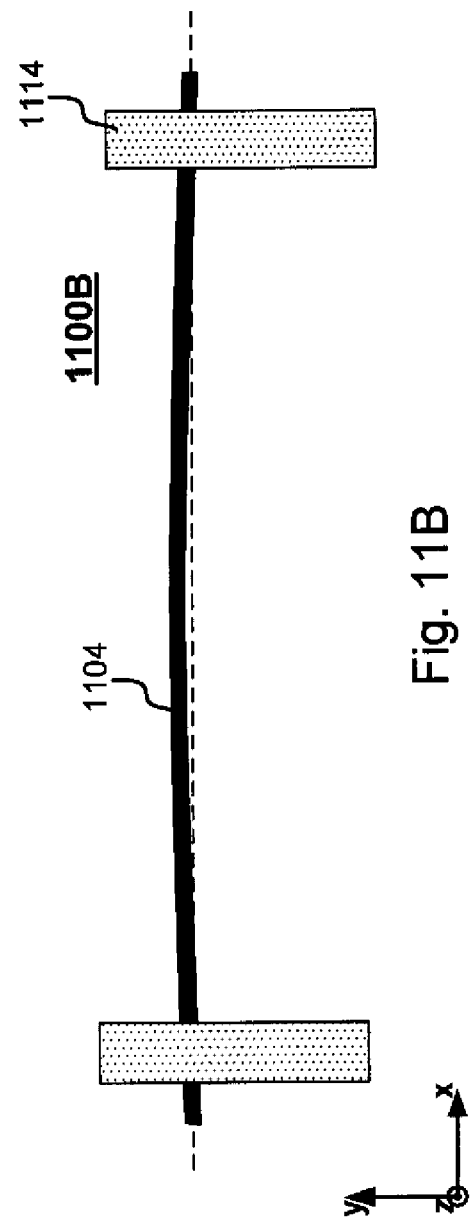
Fig. 11A
Fig. 11B

TECHNIQUES FOR INDEPENDENTLY CONTROLLING DEFLECTION, DECELERATION AND FOCUS OF AN ION BEAM

FIELD OF THE DISCLOSURE

The present disclosure relates generally to ion implantation and, more particularly, to techniques for independently controlling deflection, deceleration, and/or focus of an ion beam.

BACKGROUND OF THE DISCLOSURE

Ion implanters are widely used in semiconductor manufacturing to selectively alter conductivity of materials. In a typical ion implanter, ions generated from an ion source are directed through a series of beam-line components that may include one or more analyzing magnets and a plurality of electrodes. The analyzing magnets select desired ion species, filter out contaminant species and ions having undesirable energies, and adjust ion beam quality at a target wafer. Suitably shaped electrodes may modify the energy and the shape of an ion beam.

FIG. 1 shows a conventional ion implanter 100 which comprises an ion source 102, extraction electrodes 104, a 90° magnet analyzer 106, a first deceleration (D1) stage 108, a 700 magnet analyzer 110, and a second deceleration (D2) stage 112. The D1 and D2 deceleration stages (also known as "deceleration lenses") are each comprised of multiple electrodes with a defined aperture to allow an ion beam to pass therethrough. By applying different combinations of voltage potentials to the multiple electrodes, the D1 and D2 deceleration lenses can manipulate ion energies and cause the ion beam to hit a target wafer at a desired energy.

The above-mentioned D1 or D2 deceleration lenses are typically electrostatic triode (or tetrode) deceleration lenses. FIG. 2 shows a perspective view of a conventional electrostatic triode deceleration lens 200. The electrostatic triode deceleration lens 200 comprises three sets of electrodes: entrance electrodes 202 (also referred to as "terminal electrodes"), suppression electrodes 204 (or "focusing electrodes"), and exit electrodes 206 (also referred to as "ground electrodes" though not necessarily connected to earth ground). A conventional electrostatic tetrode deceleration lens is similar to the electrostatic triode deceleration lens 200, except that a tetrode lens has an additional set of suppression electrodes (or focusing electrodes) between the suppression electrodes 204 and the exit electrodes 206.

In the electrostatic triode deceleration lens 200, each set of electrodes may have a space/gap to allow an ion beam 20 to In view of the foregoing, it may be understood that there are significant problems and shortcomings associated with current ion implantation technologies.

SUMMARY OF THE DISCLOSURE

Techniques for independently controlling deflection, deceleration, and focus of an ion beam are disclosed. In one particular exemplary embodiment, the techniques may be realized as an apparatus for independently controlling deflection, deceleration, and focus of an ion beam. The apparatus may comprise an electrode configuration comprising a set of upper electrodes disposed above an ion beam and a set of lower electrodes disposed below the ion beam. The set of upper electrodes and the set of lower electrodes may be stationary and have fixed positions. A difference in potentials between the set of upper electrodes and the set of lower electrodes may also be varied along the central ray trajectory to reflect an energy of the ion beam at each point along the central ray trajectory for independently controlling deflection, deceleration, and/or focus of an ion beam.

In accordance with other aspects of this particular exemplary embodiment, the set of upper electrodes and the set of lower electrodes may be positioned symmetrically about a central ray trajectory of the ion beam.

In accordance with additional aspects of this particular exemplary embodiment, the difference in potentials between the set of upper electrodes and the set of lower electrodes divided by a gap between the ion beam, $(V_{upper}(z)-V_{lower}(z))/gap(z)$, may be a fixed ratio of the energy of the ion beam, $factor*E_{beam}(z)$, along the central ray trajectory.

In accordance with further aspects of this particular exemplary embodiment, the potentials added for deflection to each pair of upper electrodes and lower electrodes may be applied anti-symmetrically above and below the ion beam.

In accordance with additional aspects of this particular exemplary embodiment, the potentials added for deflection to each pair of upper electrodes and lower electrodes may be applied to only one side of the ion beam with twice the potential.

In accordance with other aspects of this particular exemplary embodiment, the electrode configuration may be a graded electrode configuration, such that a gap between the set of upper electrodes and the set of lower electrodes may be the same along the central ray trajectory of the ion beam.

In accordance with further aspects of this particular exemplary embodiment, the electrode configuration may be a flared electrode configuration, such that a gap between the set of upper electrodes and the set of lower electrodes may increase along the central ray trajectory of the ion beam.

In accordance with additional aspects of this particular exemplary embodiment, the electrode configuration may be a parallel electrode configuration, such that electrodes of the set of upper electrodes may be parallel with each other and electrodes of the set of lower electrodes may be parallel with each other.

In accordance with other aspects of this particular exemplary embodiment, electrodes of the set of upper electrodes and electrodes of the set of lower electrodes may be at least one of electrode plates and rod-shaped electrodes.

In accordance with further aspects of this particular exemplary embodiment, electrodes of the set of upper electrodes and electrodes of the set of lower electrodes may be made of at least one of non-contaminating material and a material having a low thermal expansion coefficient.

In accordance with additional aspects of this particular exemplary embodiment, electrodes of the set of upper electrodes and electrodes of the set of lower electrodes may be curved for horizontal ion beam focusing.

In accordance with other aspects of this particular exemplary embodiment, the electrode configuration may further comprise one or more side elements for horizontal beam focusing.

In accordance with further aspects of this particular exemplary embodiment, the one or more side elements may be attached to at least one electrode of the set of upper electrodes and the set of lower electrodes and one or more insulating blocks holding the set of upper electrodes and the set of lower electrodes.

In accordance with additional aspects of this particular exemplary embodiment, the one or more side elements may be held at a different potential than electrodes of the set of upper electrodes and the set of lower electrodes in order to provide additional horizontal beam focus.

In another particular exemplary embodiment, the techniques may be realized as a method for independently controlling deflection, deceleration, and/or focus of an ion beam. The method may comprise providing an electrode configuration comprising a set of upper electrodes disposed above an ion beam and a set of lower electrodes disposed below the ion beam, the set of upper electrodes and the set of lower electrodes being stationary having fixed positions. The method may also comprise varying a difference in potentials at the set of upper electrodes and the set of lower electrodes along the central ray trajectory to reflect an energy of the ion beam at each point along the central ray trajectory for independently controlling deflection, deceleration, and/or focus of an ion beam.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 11A depicts a top view of a lens configuration using rod-shaped electrodes in accordance with an embodiment of the present disclosure.

FIG. 11B depicts a top view of a lens configuration using flexed rod-shaped electrodes in accordance with an embodiment of the present disclosure.

DETAILED DESCRIPTION OF EXEMPLARY EMBODIMENTS

Embodiments of the present disclosure illustrate an improved type of electrostatic lens configuration having one or more variable-control suppression/focusing electrodes. These electrodes may include a variety of shapes, curvatures, positions, materials, and/or configurations that are independently or separately controlled/biased with respect to one another thereby providing flexible and effective manipulation of an ion beam's shape as well as its energy.

Figure 1:
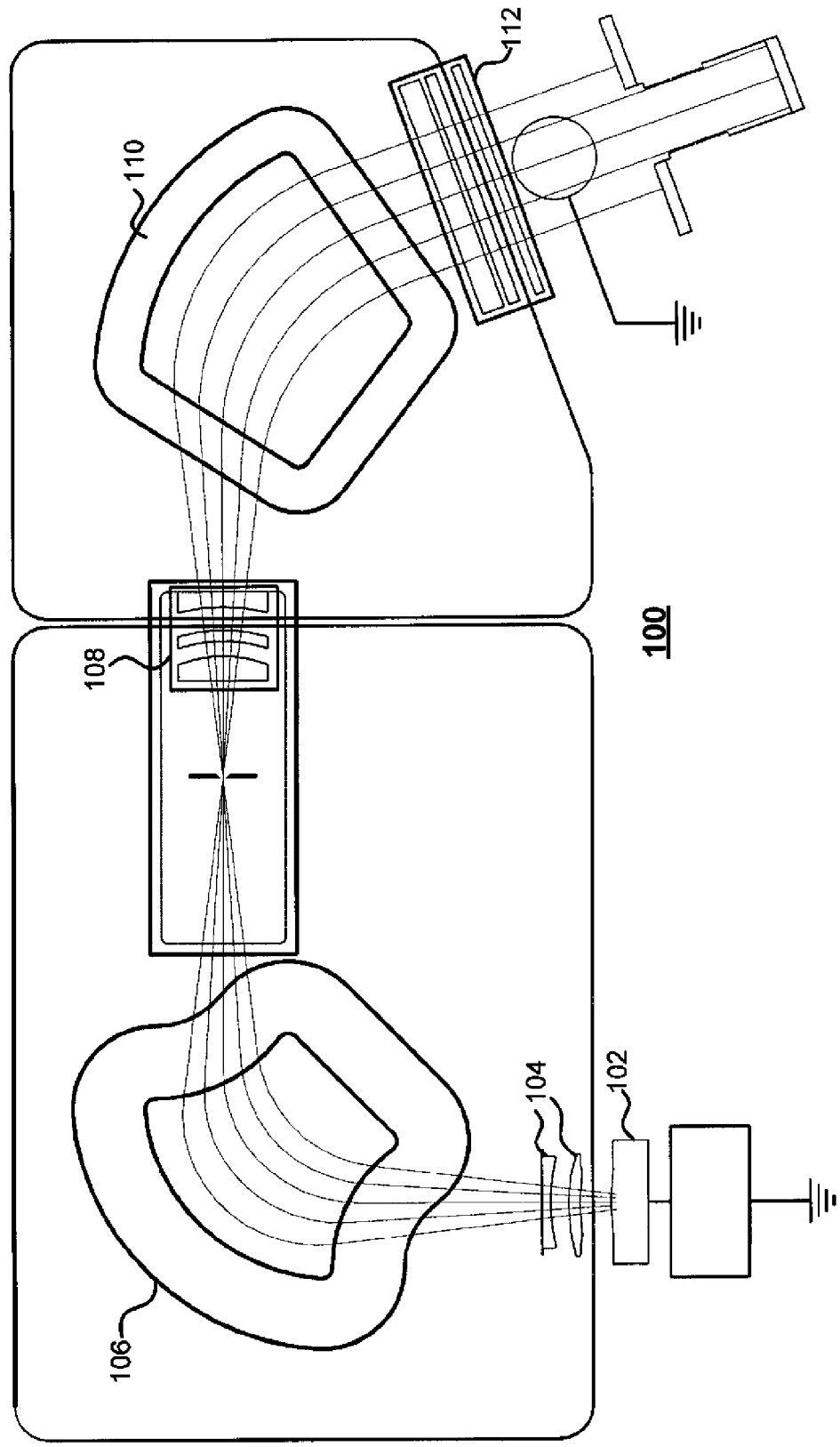
FIG. 1 depicts a conventional ion implanter.
Figure 2:
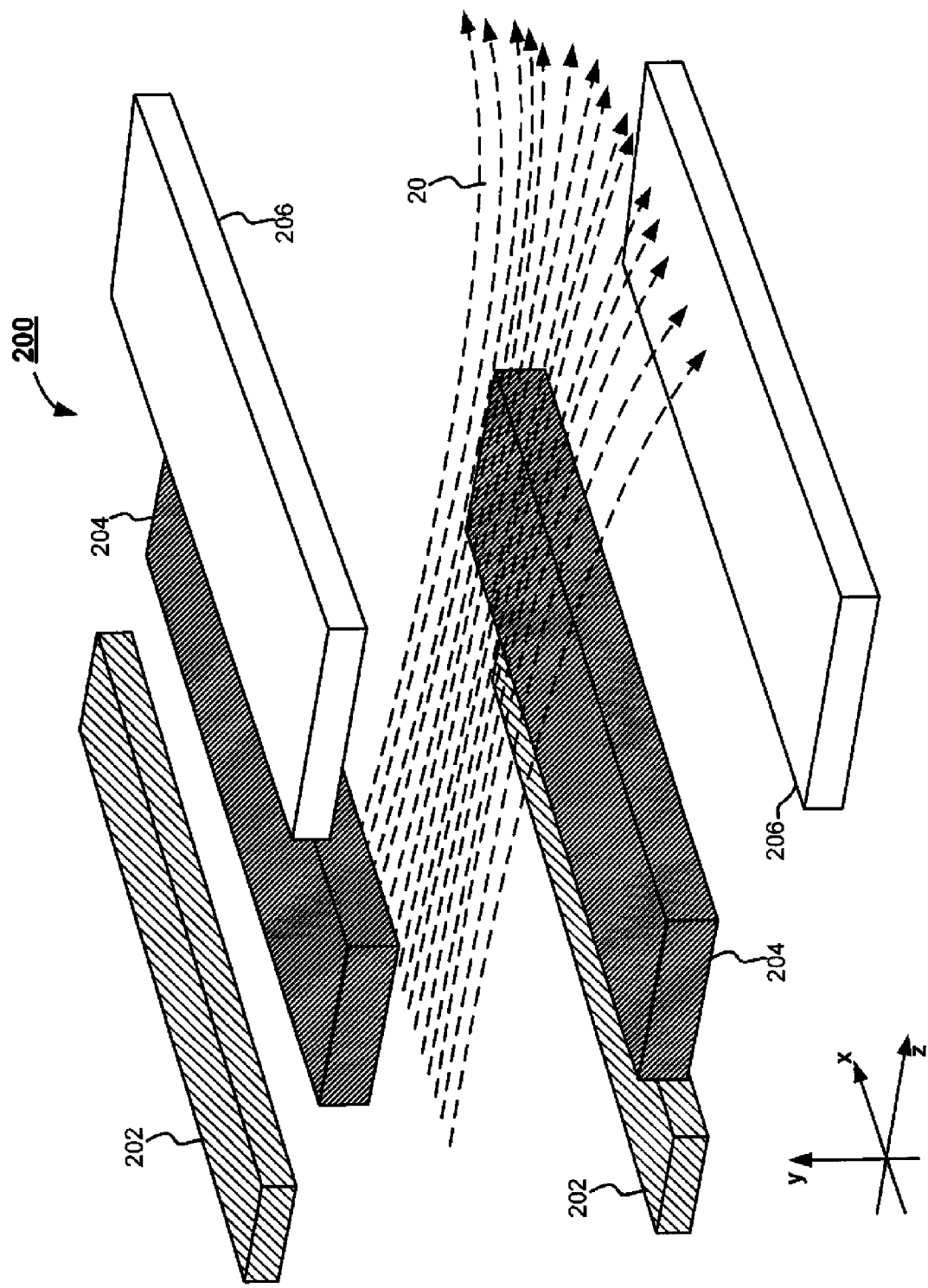
FIG. 2 depicts a conventional electrostatic triode lens.
Figure 3:
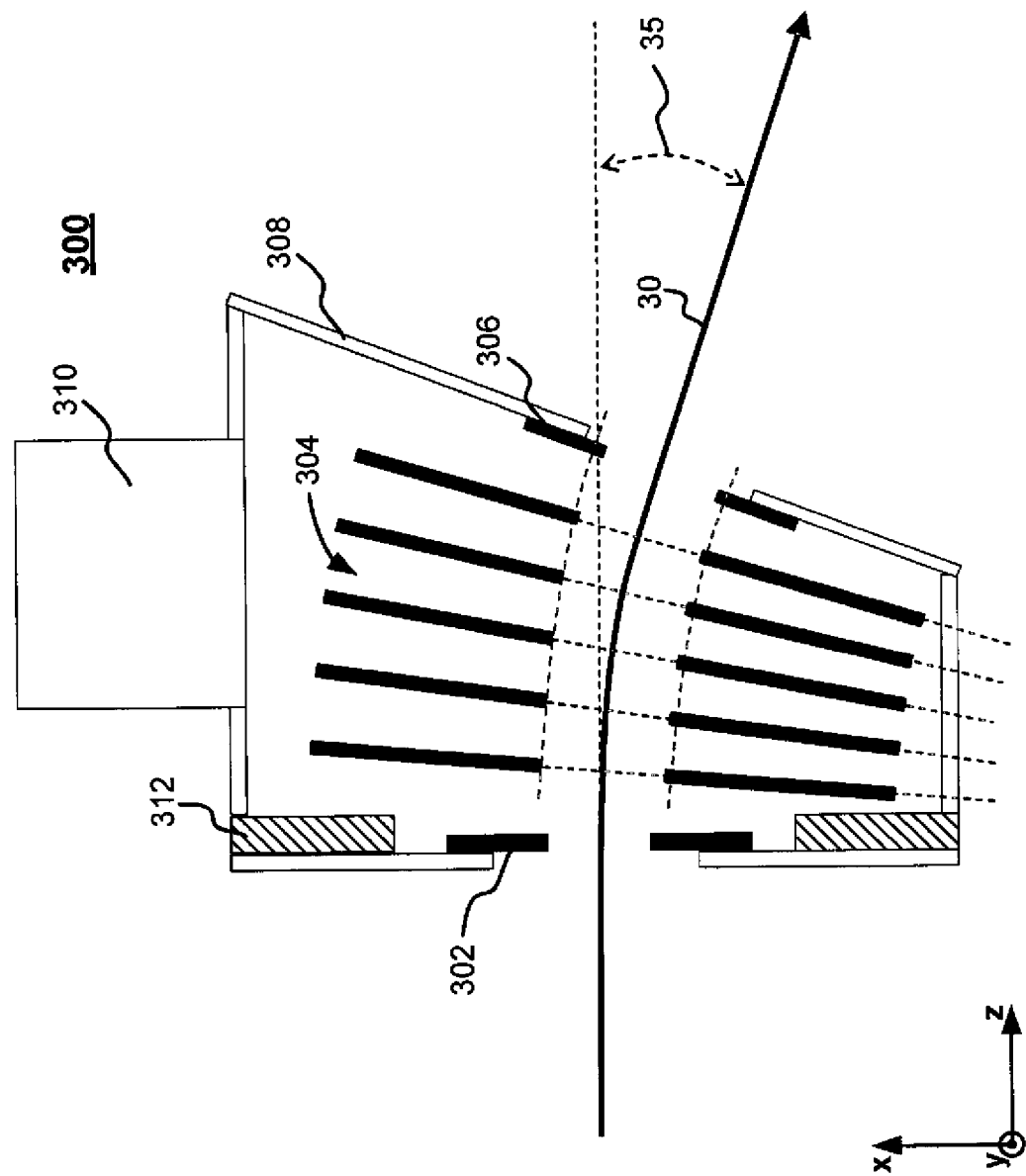
FIG. 3 depicts a side view of a graded lens configuration in accordance with an embodiment of the present disclosure.

FIG. 3 depicts a side view of a graded lens configuration 300 in accordance with an embodiment of the present disclosure. The graded lens configuration 300 may include several sets of electrodes. For example, the graded lens configuration may include a set of entrance electrodes 302, one or more sets of suppression/focusing electrodes 304, and a set of exit electrodes 306. Each set of electrodes may have a space/gap to allow an ion beam 30 (e.g., a ribbon beam) to pass therethrough. In some embodiments, these electrodes (e.g., entrance electrode 302, suppression/focusing electrodes 304, and the exit electrode 306) may be provided in a housing 308. A pump 310 may be directly or indirectly connected to the housing 308. In one embodiment, the pump 310 may be a vacuum pump for providing a high-vacuum environment or other controlled environment. In other embodiments, the housing 308 may include one or more bushings 312. These bushings 312 may be used to electrically isolate the housing 308 from other components. Other various embodiments may also be provided.

As shown in FIG. 3, each set of entrance electrodes 302 and exit electrodes 306 may include two conductive pieces electrically coupled to each other or may be a one-piece structure with an aperture for the ion beam 30 to pass therethrough. In some embodiments, upper and lower portions of suppression/focusing electrodes 304 may have different potentials (e.g., in separate conductive pieces) in order to deflect the ion beam 30 passing therethrough. For simplicity, each set of electrodes may be referred to in singular. That is, the entrance electrodes 302 may be referred to as an "entrance electrode 302," the suppression/focusing electrodes 304 may be referred to as a "suppression/focusing electrode 304," and the exit electrodes 306 may be referred to as an "exit electrode 306." Although the graded lens configuration 300 is depicted as a seven (7) element lens configuration (e.g., with five (5) sets of suppression/focusing electrodes 304), it should be appreciated that any number of elements (or electrodes) may be utilized. For example, in some embodiments, the graded lens configuration 300 may utilize a range of three (3) to ten (10) electrode sets. Other various embodiments may also be provided.

In some embodiments, the ion beam 30 passing through the electrodes may include boron or other elements. Electrostatic focusing of the ion beam 30 may be achieved by using several thin electrodes (e.g., the suppression/focusing electrodes 304) to control "grading" of potential along an ion beam path or beamline 30. In the graded lens configuration 300, high deceleration ratios may also be provided while avoiding overfocusing. As a result, use of input ion beams 30 may be used in an energy range that may enable higher quality beams, even for very low energy output beams. In one embodiment, as the ion beam 30 passes through the electrodes of the lens configuration 300, the ion beam 30 may be decelerated from 6 keV to 0.2 keV and deflected at 15° by the electrodes of the graded lens configuration 300. In this example, the energy ratio may be 30/1. Other various embodiments may also be provided.

It should be appreciated that separating and independently controlling deceleration, deflection, and/or focus may be accomplished by: (1) maintaining symmetry of electrodes (e.g., the entrance electrode 302, suppression/focusing electrodes 304, and the exit electrode 306) with respect to a central ray trajectory ("c.r.t." or "crt") of the ion beam 30, and (2) varying deflection voltages along the crt of the ion beam 30 to reflect beam energy at each point along the crt at a deflection angle 35. By symmetry of the electrodes with respect to the crt of the ion beam 30, it should be appreciated that the ends of upper and lower electrodes closest to the ion beam 30 may be maintained at equal (or near-equal) perpendicular distances from the crt of the ion beam 30.

For example, a difference in voltages on electrodes above and below the ion beam 30 (e.g., $V_{defl}(z)$) may be configured so that a deflection component of the electric field (e.g., $(V_{upper}(z)-V_{lower}(z))/gap(z)$) may be a fixed ratio/factor of the beam energy at that point (which may vary along the electrodes or lenses) (e.g., factor*$E_{beam}(z)$). For example, this may be expressed as Equation 1 below:

$$V_{defl}(z)/gap(z) = \text{factor} * E_{beam}(z)$$

In some embodiments, this deflection voltage may be applied anti-symmetrically above and/or below (e.g., $+/-V_{defl}(z)$). In other embodiments, for example, the deflection voltage may be applied to just one side of the ion beam 30 with twice the deflection voltage. It should be appreciated that since such relationship between the top and bottom electrode voltage may be fixed for a given geometry, it may be possible to implement this relationship in a circuit network or other similar network. Accordingly, a need for doubling the number of power supplies and/or fixing this relationship in hardware may be reduced, if not completely eliminated. Other various embodiments may also be provided.

FIGS. 4A-4D depict illustrative graphs 400A-400D of deflection, deceleration, and/or focus in a graded lens configuration in accordance with an embodiment of the present disclosure. In these illustrative graphs 400A-400D, the ion beam 30 may be depicted with differing emittance and voltages/bias at each electrode producing various focus conditions. It should be appreciated that each exemplary graph may use a deflection factor (as described above in Equation 1) of 0.16 and may produce the same or similar a deflection (e.g., deflection of 15°).

Figure 4A:
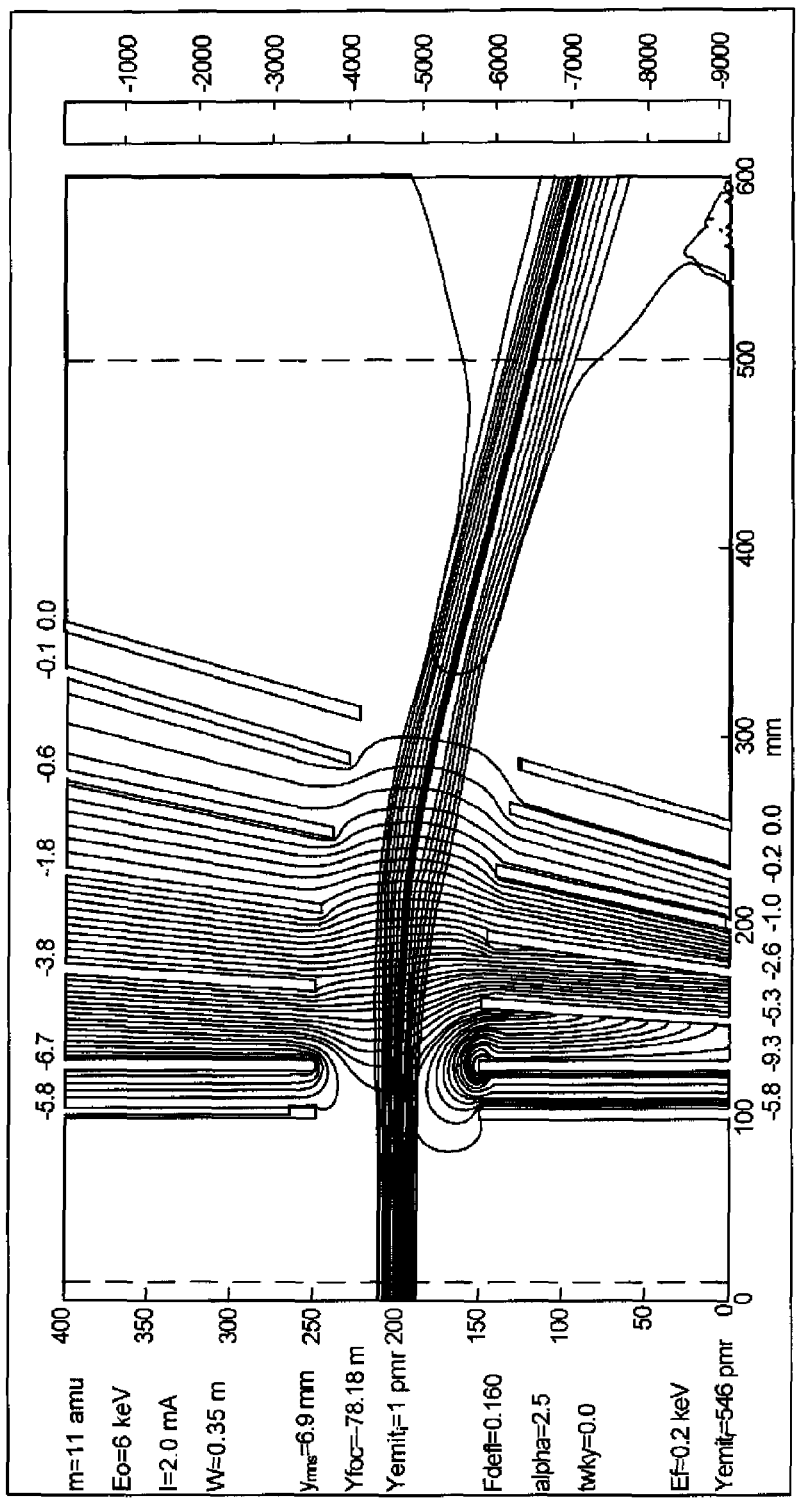
FIGS. 4A-4D depict illustrative graphs of deflection, deceleration, and/or focus in a graded lens configuration in accordance with an embodiment of the present disclosure.
Figure 4B:
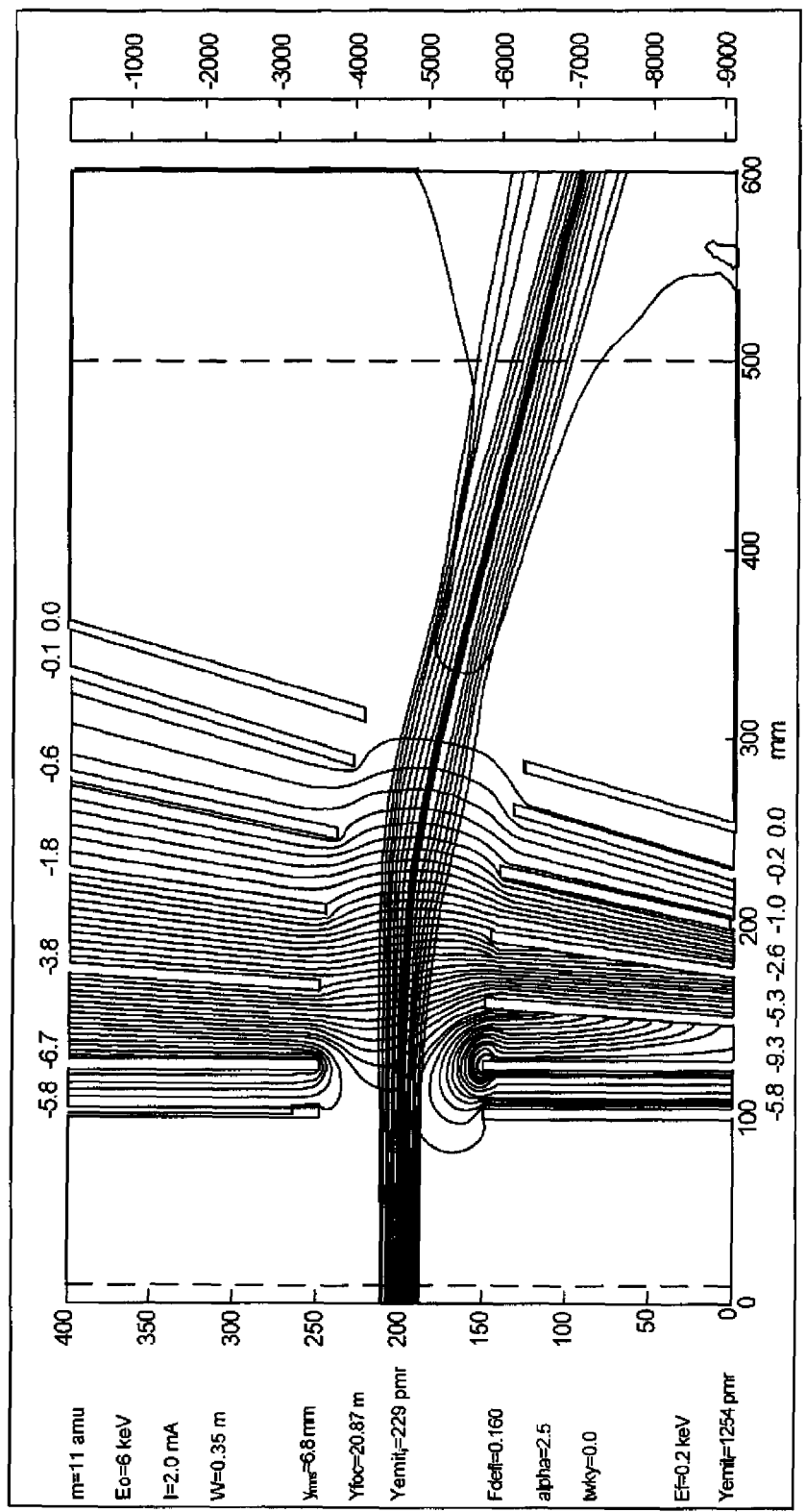
Figure 4C:
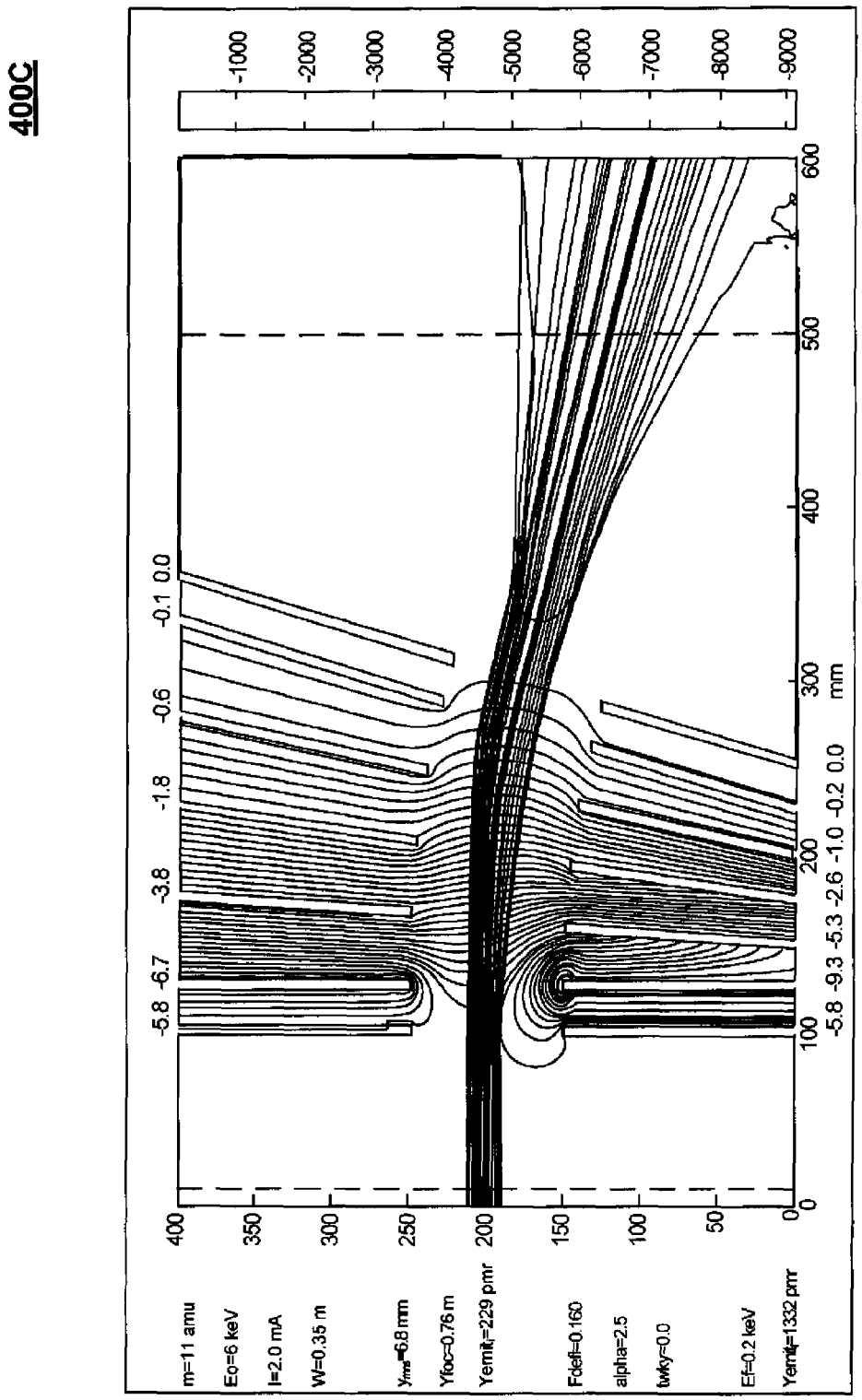
Figure 4D:
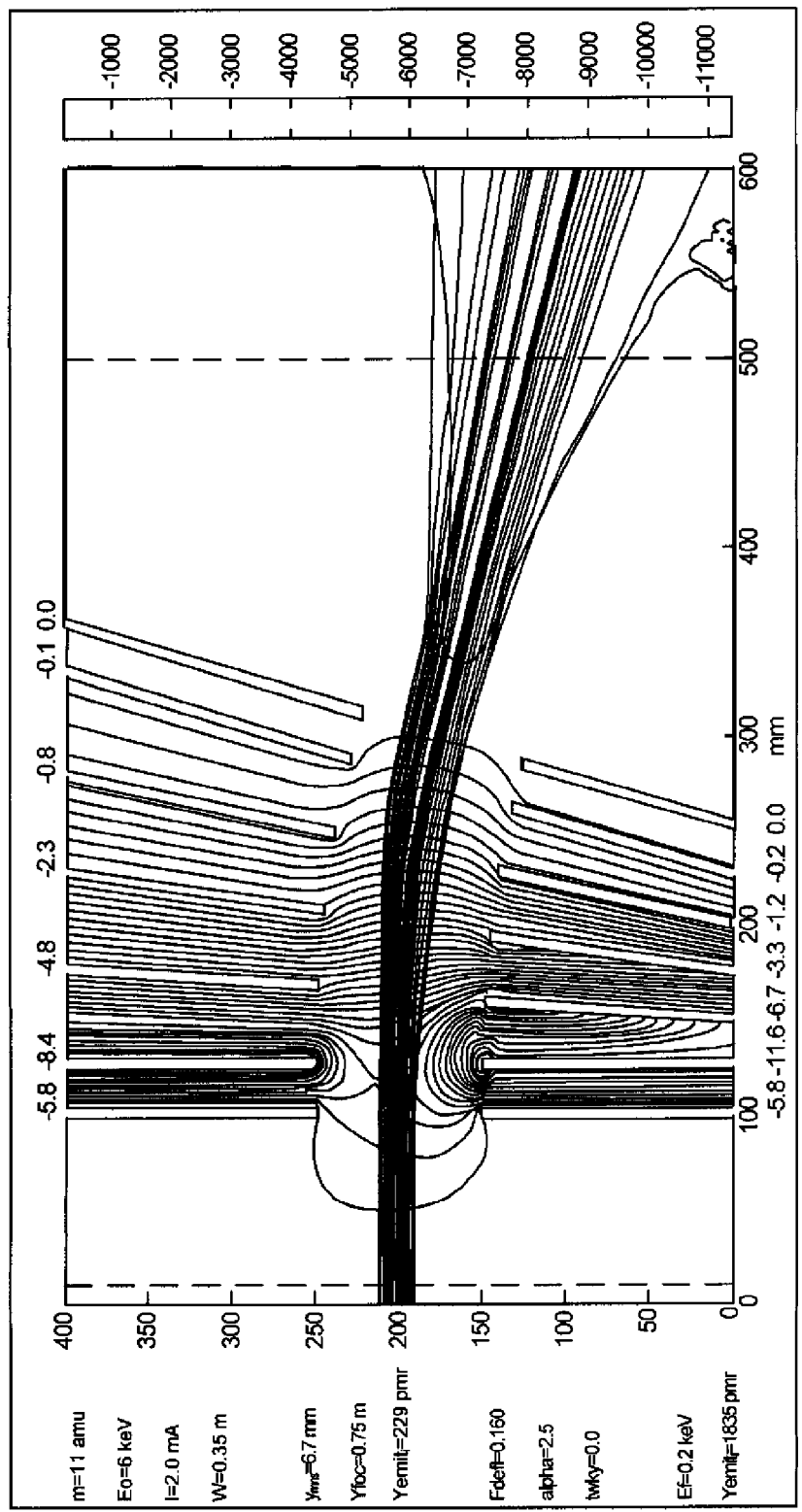

For example, FIG. 4A depicts an illustrative graph 400A of deflection, deceleration, and/or focus in a graded lens configuration using a zero (0) emittance ion beam, FIG. 4B depicts an illustrative graph 400B of deflection, deceleration, and/or focus in a graded lens configuration using a non-zero emittance ion beam, FIG. 4C depicts an illustrative graph 400C of deflection, deceleration, and/or focus in a graded lens configuration using a non-zero emittance ion beam with convergence, and FIG. 4D depicts an illustrative graph 400D of deflection, deceleration, and/or focus in a graded lens configuration using different focus voltages. In most situations, the deflection factor of Equation 1 may be maintained as 0.16 Other various embodiments may also be provided.

Figure 5:
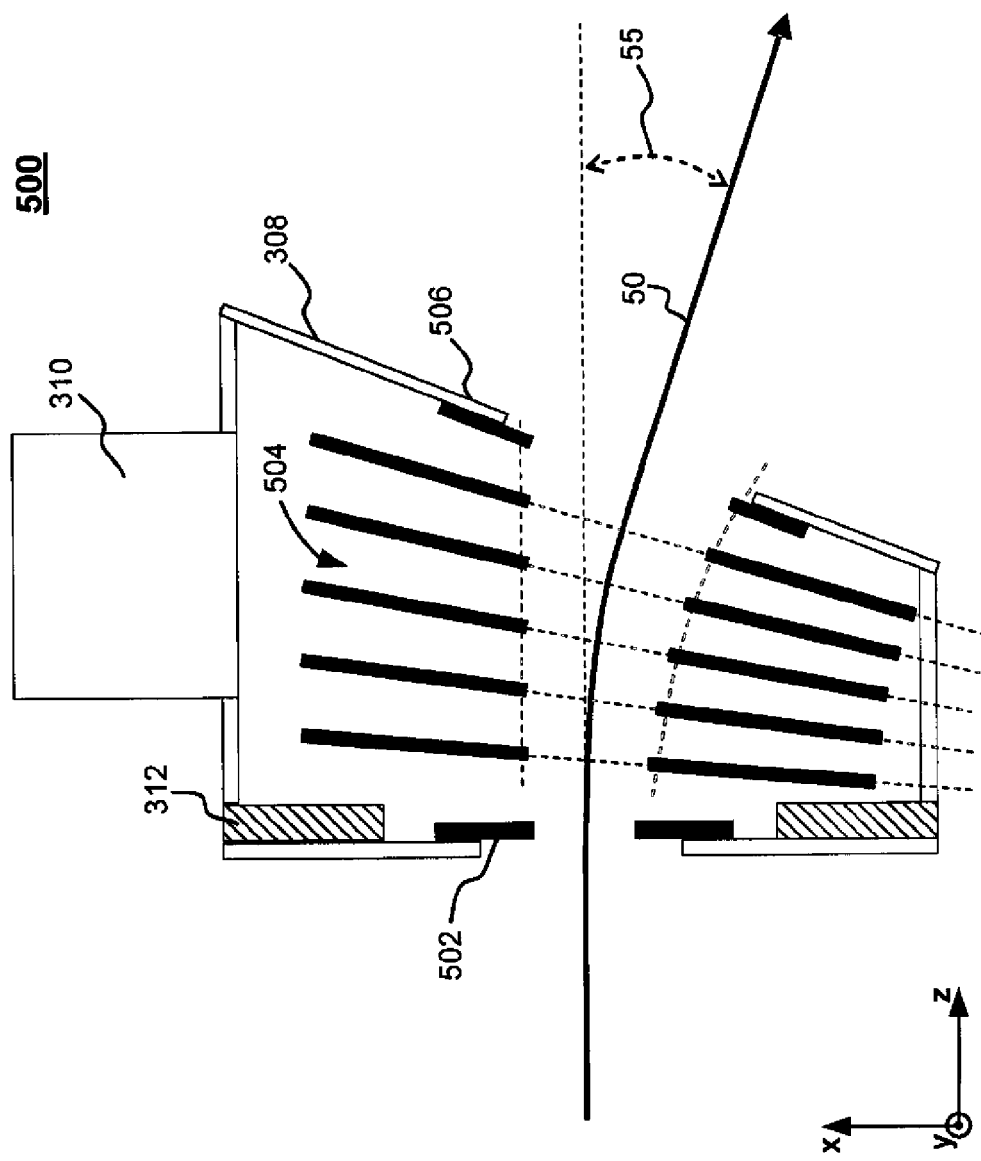
FIG. 5 depicts a side view of a flared lens configuration in accordance with an embodiment of the present disclosure.

FIG. 5 depicts a side view of a flared lens configuration 500 in accordance with an embodiment of the present disclosure. Similar to the graded lens configuration 300 of FIG. 3, the flared lens configuration 500 may also include several sets of electrodes, such as a set of entrance electrodes 502, one or more sets of suppression/focusing electrodes 504, and a set of exit electrodes 506. Each set of electrodes may have an opening to allow an ion beam 50 to pass therethrough at a deflection angle 55. Although the flared lens configuration 500 is depicted as a seven (7) element lens configuration, which is similar to FIG. 3, it should be appreciated that any number of elements (or electrodes) may be utilized. For example, in some embodiments, the flared lens configuration 500 may utilize a range of three (3) to ten (10) electrode sets. Other various embodiments may also be provided.

However, unlike FIG. 3, the electrodes of the flared lens configuration 500 of FIG. 5 may be positioned in a "flared" configuration. For example, an opening for the ion beam 50 at the exit electrode 506 may be greater than an opening for the ion beam 50 at the entrance electrode 502. Accordingly, openings at each set of the suppression/focusing electrodes 504 may gradually increase or "flare" open. It should be appreciated that while the electrodes in this configuration are flared (e.g., in order to avoid beam strikes on the electrodes), symmetry may still be maintained about a central ray trajectory ("c.r.t" or "crt") of the ion beam 50. Other various embodiments may also be provided.

Figure 6A:
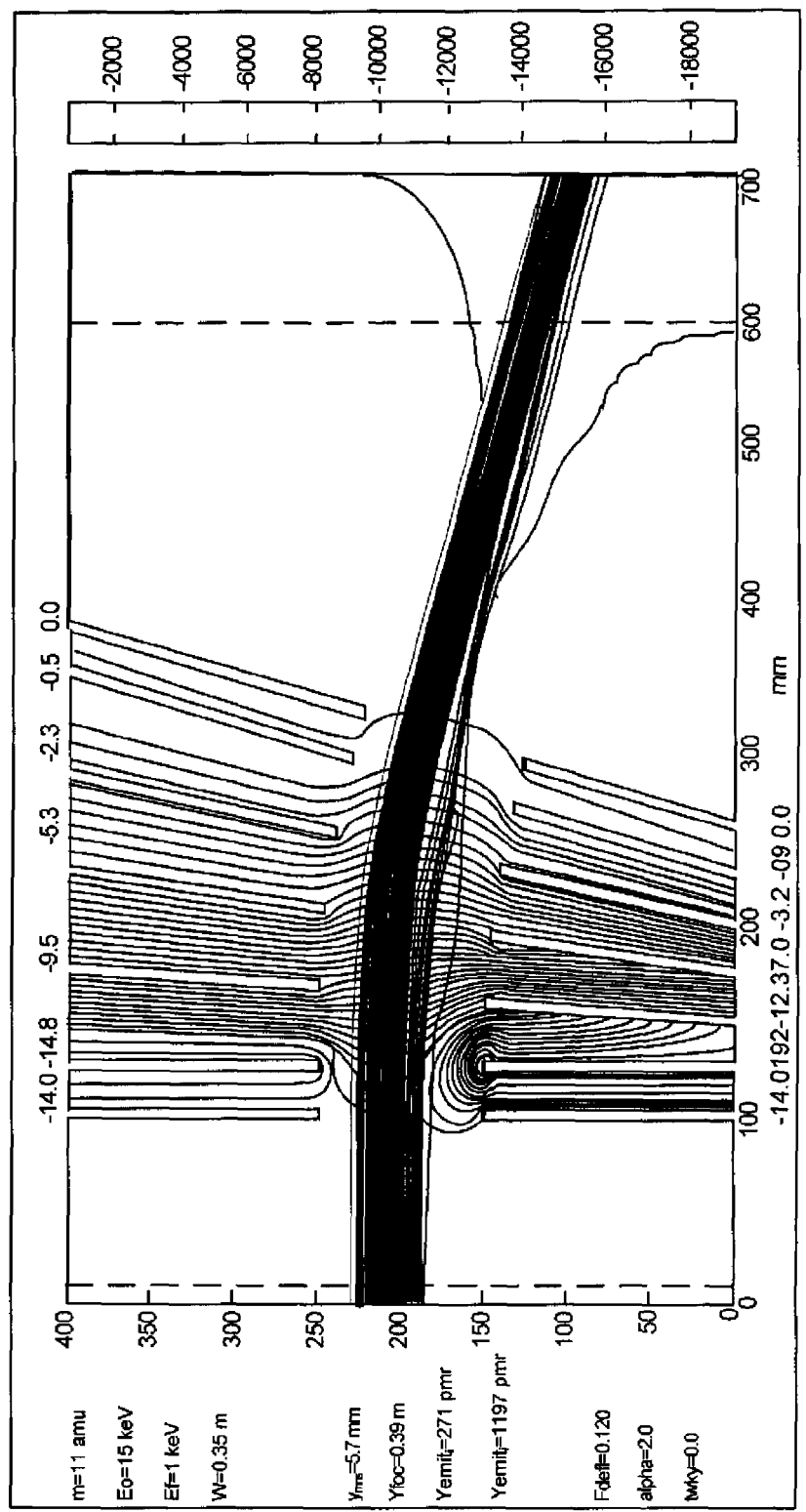
FIGS. 6A-6C depict illustrative graphs of deflection, deceleration, and/or focus in a flared lens configuration in accordance with an embodiment of the present disclosure.

FIG. 6A depicts an illustrative graph 600A of deflection, deceleration, and/or focus in a flared lens configuration in accordance with an embodiment of the present disclosure. In this example, symmetry may be maintained about the crt of the ion beam 50, while flaring the electrodes in order to avoid beam strikes on the electrodes.

Figure 6B:
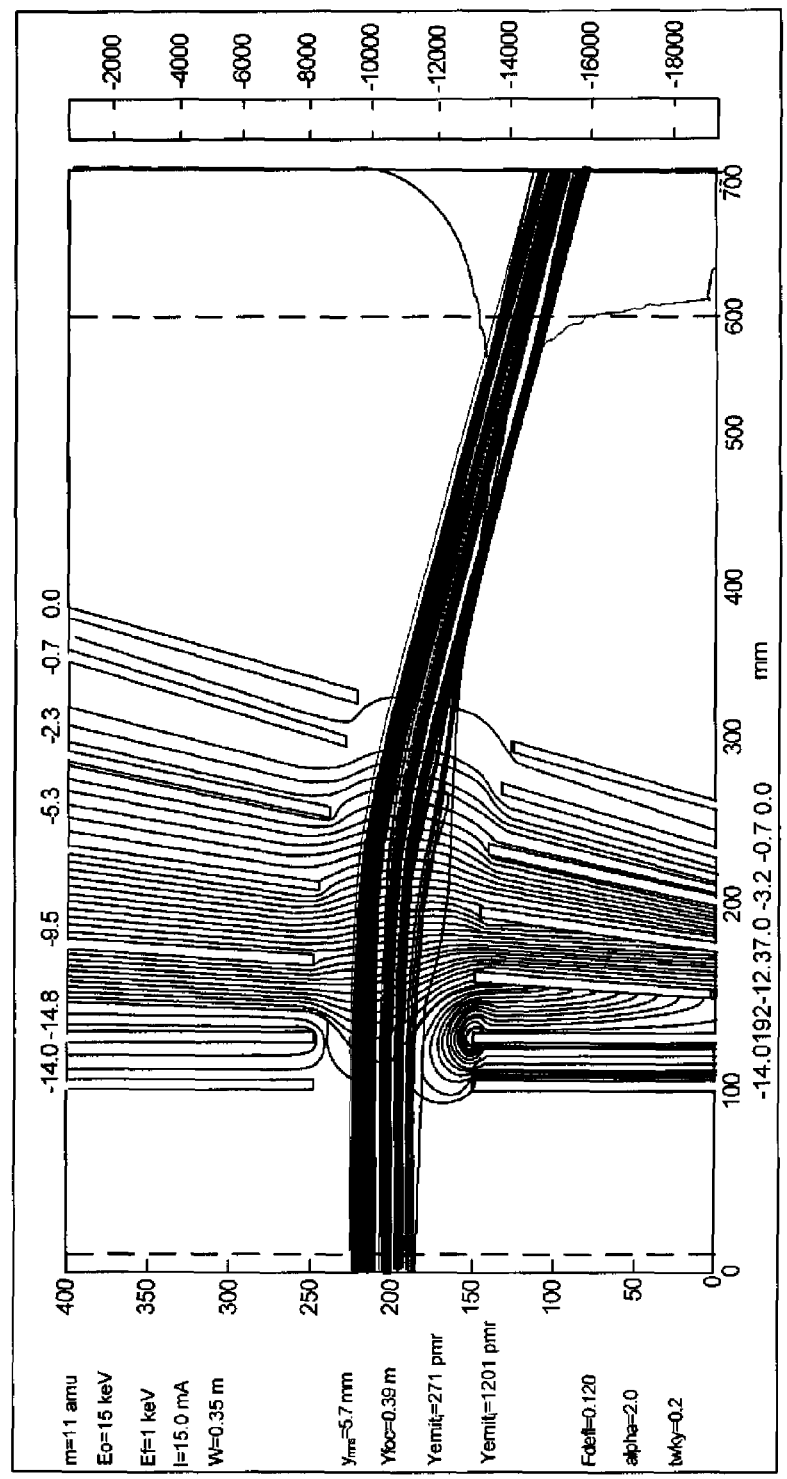
Figure 6C:
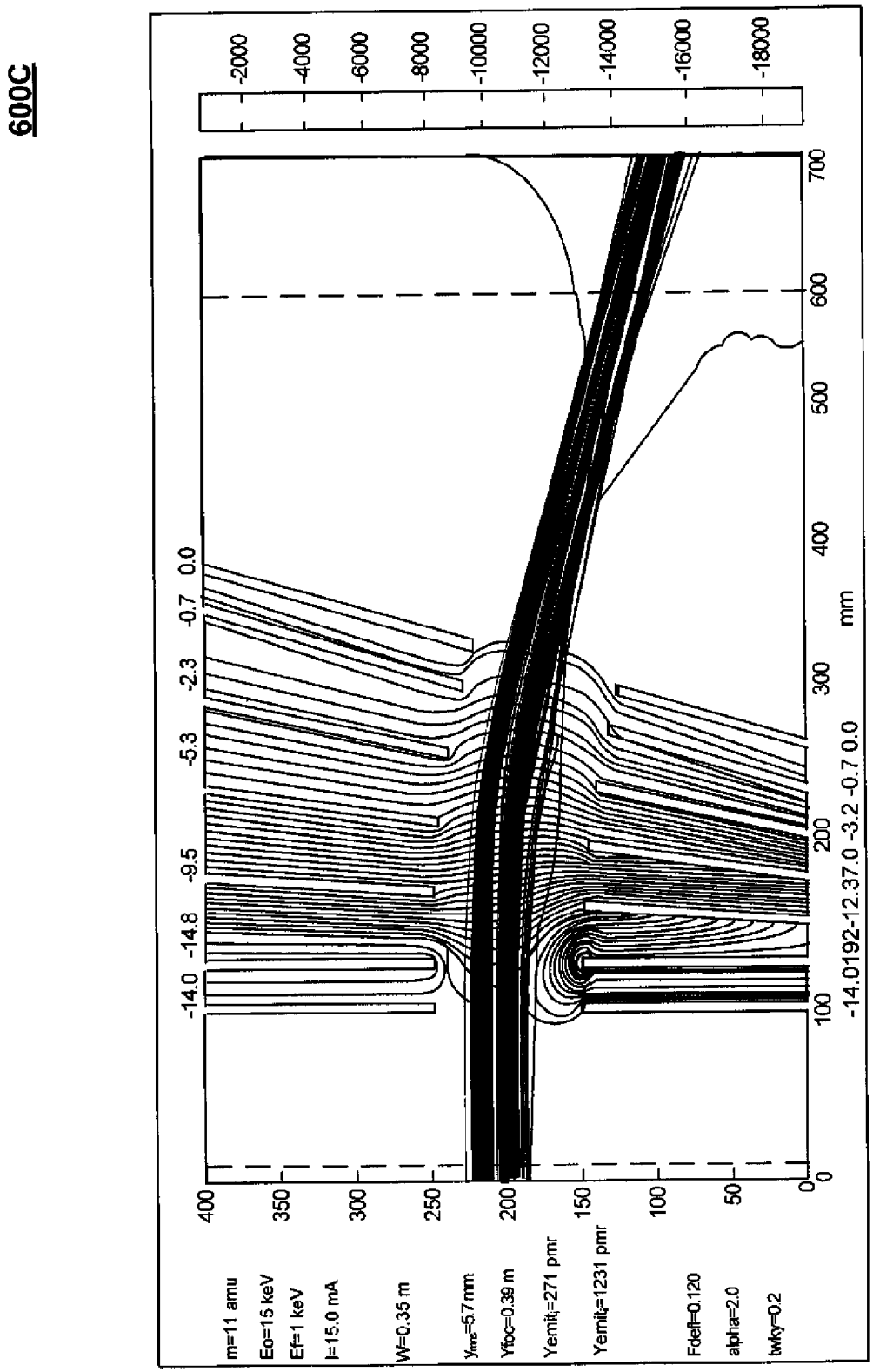

FIGS. 6B-6C depict illustrative graphs 600B, 600C of deflection, deceleration, and/or focus in a flared lens configuration in accordance with an embodiment of the present disclosure. It should be appreciated that although the deflection angle is determined by the deflection factor, as expressed in Equation 1, final control of the deflection angle 55 may be further enhanced with minor adjustments or "tweaking." For example, tweaking may be achieved by adding a small deflection potential/voltage at the last electrode (e.g., the last suppression/focusing electrode 504), which may be scaled to a final energy. Referring to FIG. 6B, an illustrative graph 600B of deflection, deceleration, and/or focus in a flared lens configuration with a −0.2 "tweaking" effect is shown. Referring to FIG. 6C, an illustrative graph 600C of deflection, deceleration, and/or focus in a flared lens configuration with a +0.2 "tweaking" effect is shown. Other variations may also be provided.

Figure 7:
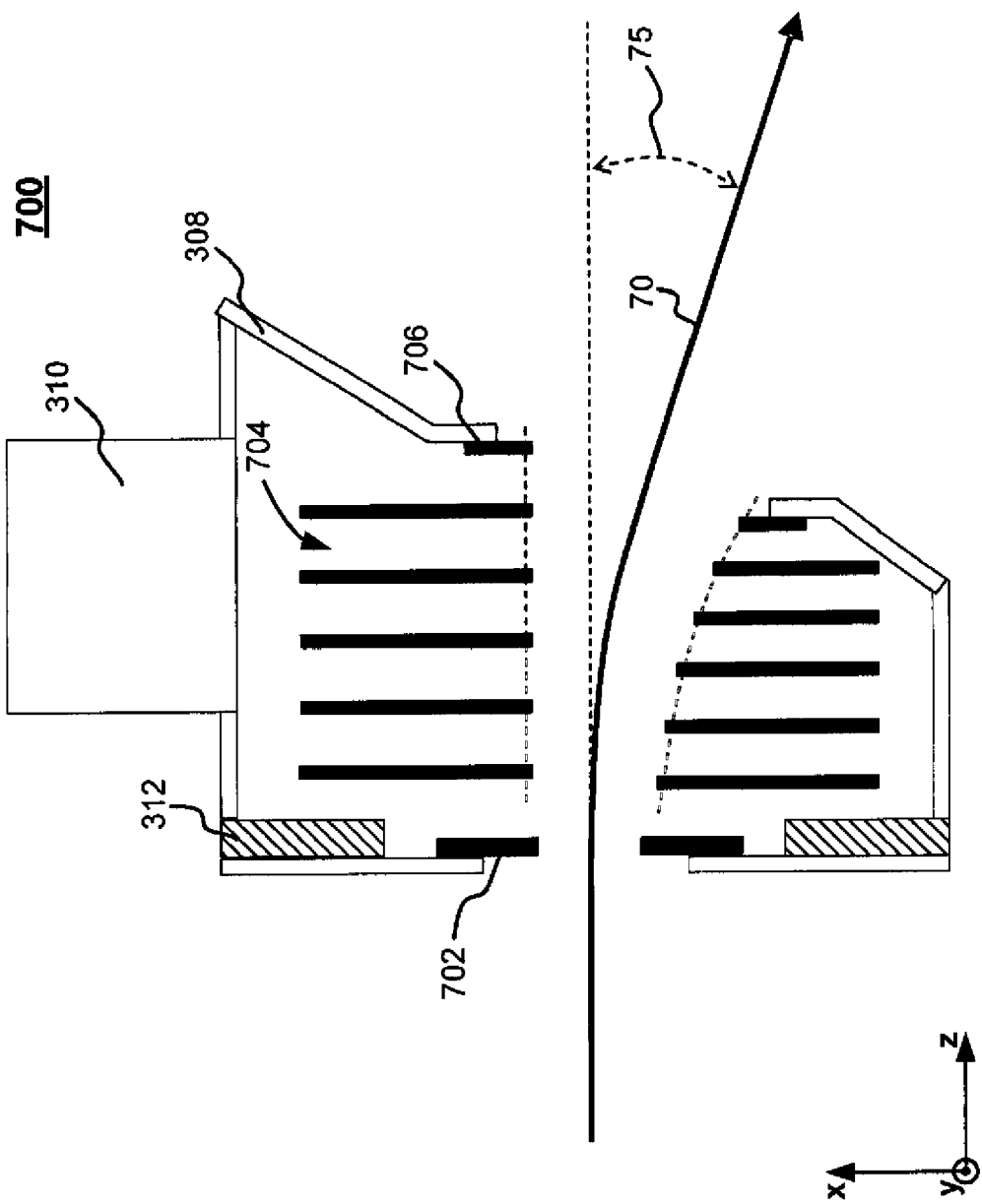
FIG. 7 depicts a side view of a parallel lens configuration in accordance with an embodiment of the present disclosure.

FIG. 7 depicts a side view of a parallel lens configuration 700 in accordance with an embodiment of the present disclosure. Similar to the flared lens configuration 500 of FIG. 5, the parallel lens configuration 700 may also include several sets of electrodes, such as a set of entrance electrodes 702, one or more sets of suppression/focusing electrodes 704, and a set of exit electrodes 706. Each set of electrodes may have a space/gap to allow ions to pass therethrough with a central ray trajectory ("c.r.t." or "crt") of an ion beam 70 and at a deflection angle 75. Although the parallel lens configuration 700 is depicted as a seven (7) element lens configuration, similar to FIG. 5, it should be appreciated that any number of elements (or electrodes) may be utilized. For example, in some embodiments, the parallel lens configuration 700 may utilize a range of three (3) to ten (10) electrode sets. Other various embodiments may also be provided.

It should also be appreciated that the electrodes in the parallel lens configuration 700 may be "flared" like the flared lens configuration 500 of FIG. 5. For example, an opening for the ion beam 70 at the exit electrode 706 may be greater than an opening for the ion beam 70 at the entrance electrode 702. Accordingly, openings at each set of the suppression/focusing electrodes 704 may gradually increase or "flare" open. Also, symmetry may be maintained about the crt of the ion beam 70 in order to avoid aberrations in the ion beam 70. It should be appreciated that although the parallel lens configuration 700 is depicted with electrodes in a flared configuration, other various embodiments may also be provided (e.g., a graded configuration, etc.).

However, unlike FIG. 5, the electrodes of the parallel lens configuration 700 of FIG. 7 may be parallel to each other. For example, rather than being angled to maintain symmetry about the crt, the electrodes may be parallel to one another such that the edges of the electrodes remain in a similar position with respect to the edges of the electrodes in the flared lens configuration 500 of FIG. 5.

There are several benefits associated with the parallel lens configuration 700 of FIG. 7. For example, in the parallel lens configuration 700, the electrodes may be more easily positioned than in a flared or graded position, which may require more precision and accuracy. Therefore, as long as the position of the edges of the electrodes of the parallel lens configuration 700 remain similarly situated to that of the edges of the electrodes of the flared lens configuration 500 of FIG. 5, the ion beam 70 may be minimally affected by the change in configuration. Other various embodiments may also be provided.

Figure 8:
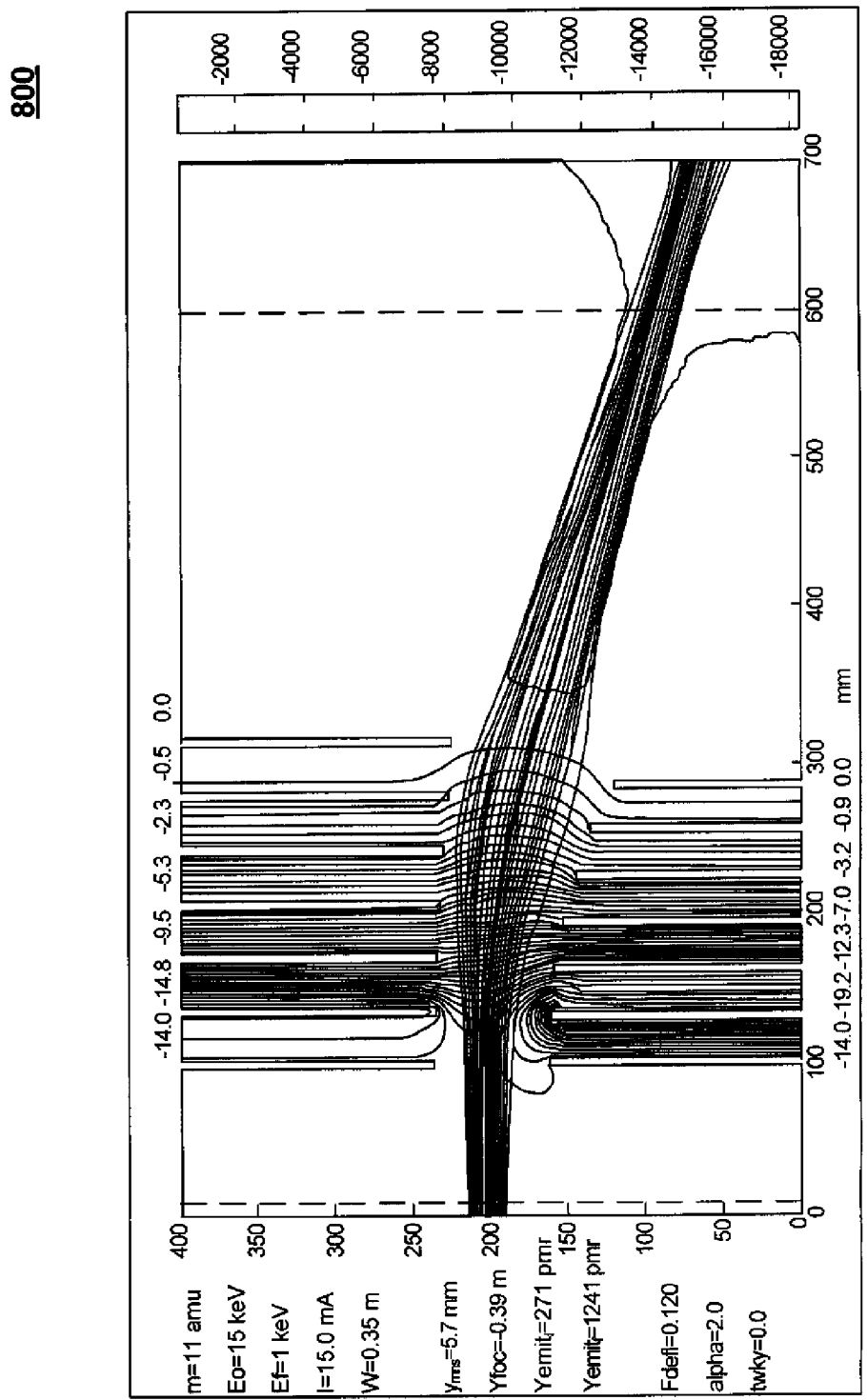
FIG. 8 depicts an illustrative graph of deflection, deceleration, and/or focus of a parallel lens configuration in accordance with an embodiment of the present disclosure.

FIG. 8 depicts an illustrative graph 800 of deflection, deceleration, and/or focus of a parallel lens configuration in accordance with an embodiment of the present disclosure. Here, electrode plates may be parallel to each other and flared to provide independent control of deflection, deceleration, and/or focus.

Figure 9:
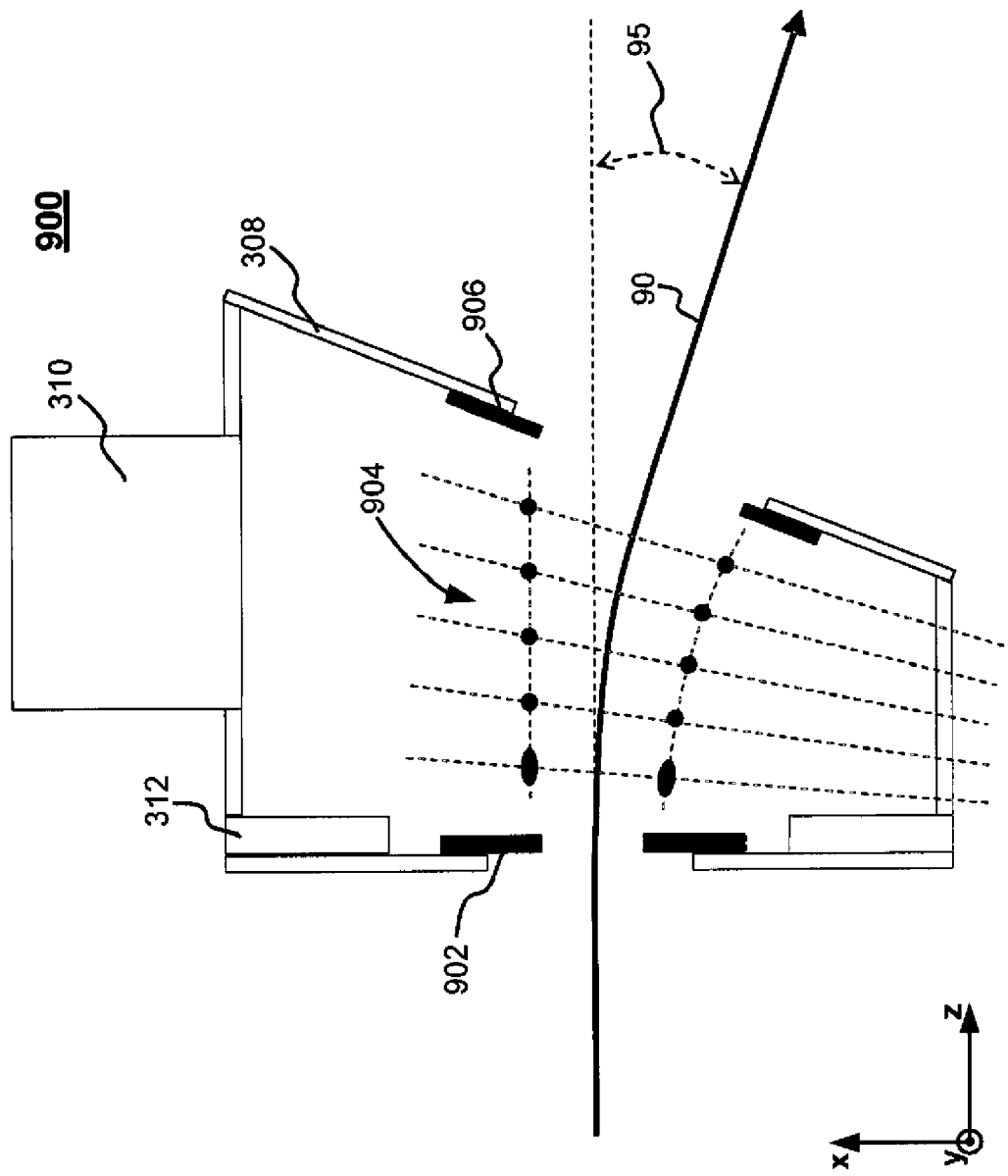
FIG. 9 depicts a side view of a lens configuration using rod-shaped electrodes in accordance with an embodiment of the present disclosure.

FIG. 9 depicts a side view of a lens configuration 900 using rod-shaped electrodes in accordance with an embodiment of the present disclosure. Similar to the flared lens configuration 500 of FIG. 5, the lens configuration 900 using rod-shaped electrodes may also include several sets of electrodes, such as a set of entrance electrodes 902, one or more sets of suppression/focusing electrodes 904, and a set of exit electrodes 906. Each set of electrodes may have a space/gap to allow ions to pass therethrough with a central ray trajectory ("c.r.t." or "crt") of an ion beam 90 and at a deflection angle 95. Although the lens configuration 900 using rod-shaped electrodes is depicted as a seven (7) element lens configuration, similar to FIG. 5, it should be appreciated that any number of elements (or electrodes) may be utilized. For example, in some embodiments, the lens configuration 900 using rod-shaped electrodes may utilize a range of three (3) to ten (10) electrode sets. Other various embodiments may also be provided.

It should also be appreciated that the electrodes in the lens configuration 900 using rod-shaped electrodes may be "flared" like the flared lens configuration 500 of FIG. 5. For example, an opening for the ion beam 90 at the exit electrode 906 may be greater than an opening for the ion beam 90 at the entrance electrode 902. Accordingly, openings at each set of the suppression/focusing electrodes 904 may gradually increase or "flare" open. Also, symmetry may be maintained about the crt of the ion beam 90. It should be appreciated that although the lens configuration 900 using rod-shaped electrodes is depicted with electrodes in a flared configuration, other various embodiments may also be provided (e.g., a graded configuration, etc.).

Figure 10:
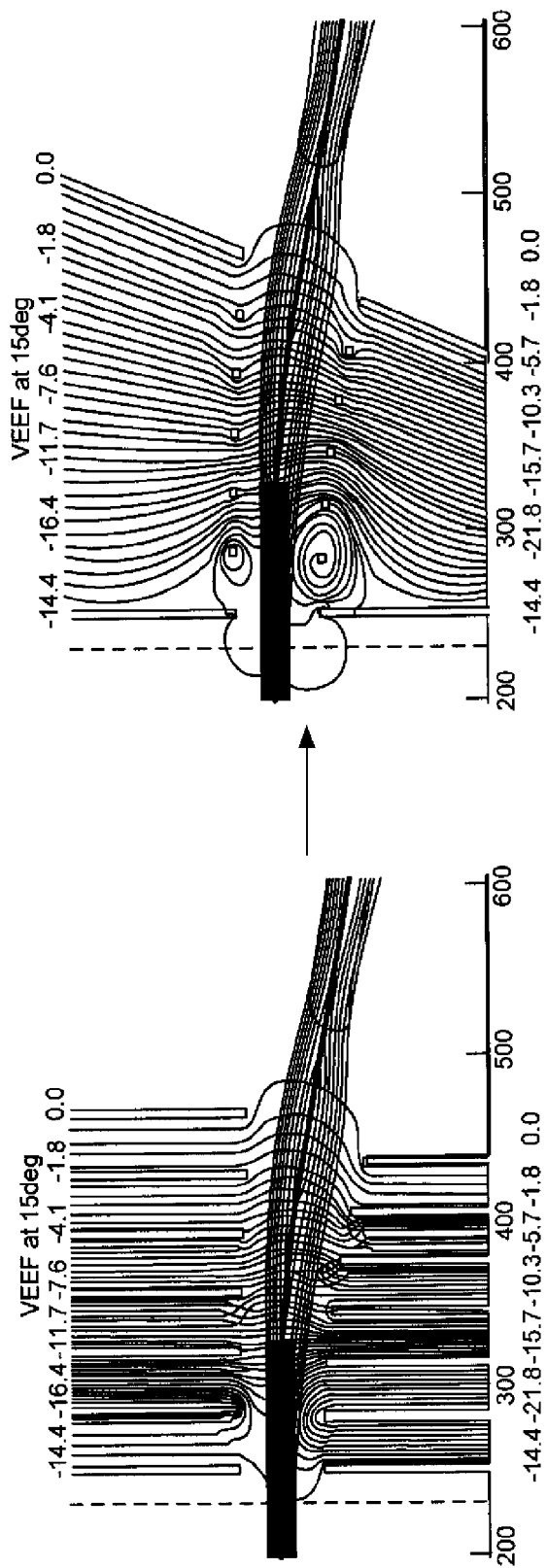
FIG. 10 depicts an illustrative graph of deflection, deceleration, and/or focus of a lens configuration using rod-shaped electrodes as compared to a parallel lens configuration in accordance with an embodiment of the present disclosure.

However, unlike FIG. 5, the suppression/focusing electrodes 904 of the lens configuration 900 of FIG. 9 may be rod-shaped electrodes rather than electrode plates. As long as the position of the rod-shaped electrodes remain similarly situated to edges of the electrodes of the flared lens configuration 500 of FIG. 5, the ion beam 90 may be minimally affected. For example, FIG. 10 depicts an illustrative graph 1000 of deflection, deceleration, and/or focus of a lens configuration using rods as compared to a parallel lens configuration in accordance with an embodiment of the present disclosure. Here, the rod-shaped electrode rods may effectively provide independent control of deflection, deceleration, and/or focus in accordance with an embodiment of the present disclosure.

The rod-shaped electrodes may be made of non-contaminating material, such as graphite, glassy carbon, and/or other non-contaminating material. It should be appreciated that the electrodes may also be made of materials with low thermal expansion coefficients. Other various embodiments may also be provided.

Using rod-shaped electrodes may have several benefits. For example, surface areas of rod-shaped electrodes (or rods) may have substantially lower than surface areas of electrode plates. Therefore, rod-shaped electrodes may help minimize probability of discharges, glitches, and/or spontaneous generation of charged particles. Furthermore, using rod-shaped electrodes may allow a more open geometry, which may in turn allow for greater pumping (e.g., by the vacuum pump 310). As a result, pressure may be minimized so that charge exchange and residual energy contamination may be reduced.

FIG. 11A depicts a top view of a lens configuration 1100A using rod-shaped electrodes in accordance with an embodiment of the present disclosure. In this example, a rod-shaped electrode 1104 may be mounted through holes (not shown) in one or more insulating blocks 1114 or conductive plates with insulating bushings. Use of insulating blocks 1114 or bushings allow the rod-shaped electrode's position to be maintained independent of fluctuations in temperature.

FIG. 11B depicts a top view of a lens configuration 1100B using flexed rod-shaped electrodes in accordance with an embodiment of the present disclosure. By angling holes in the one or more insulating blocks 1114 or bushings, the rod-shaped electrode 1104 may be flexed, curved, and/or arched. A benefit of flexing the rod-shaped electrode 1104 may be to provide greater horizontal focusing of an ion beam.

Figure 11C:
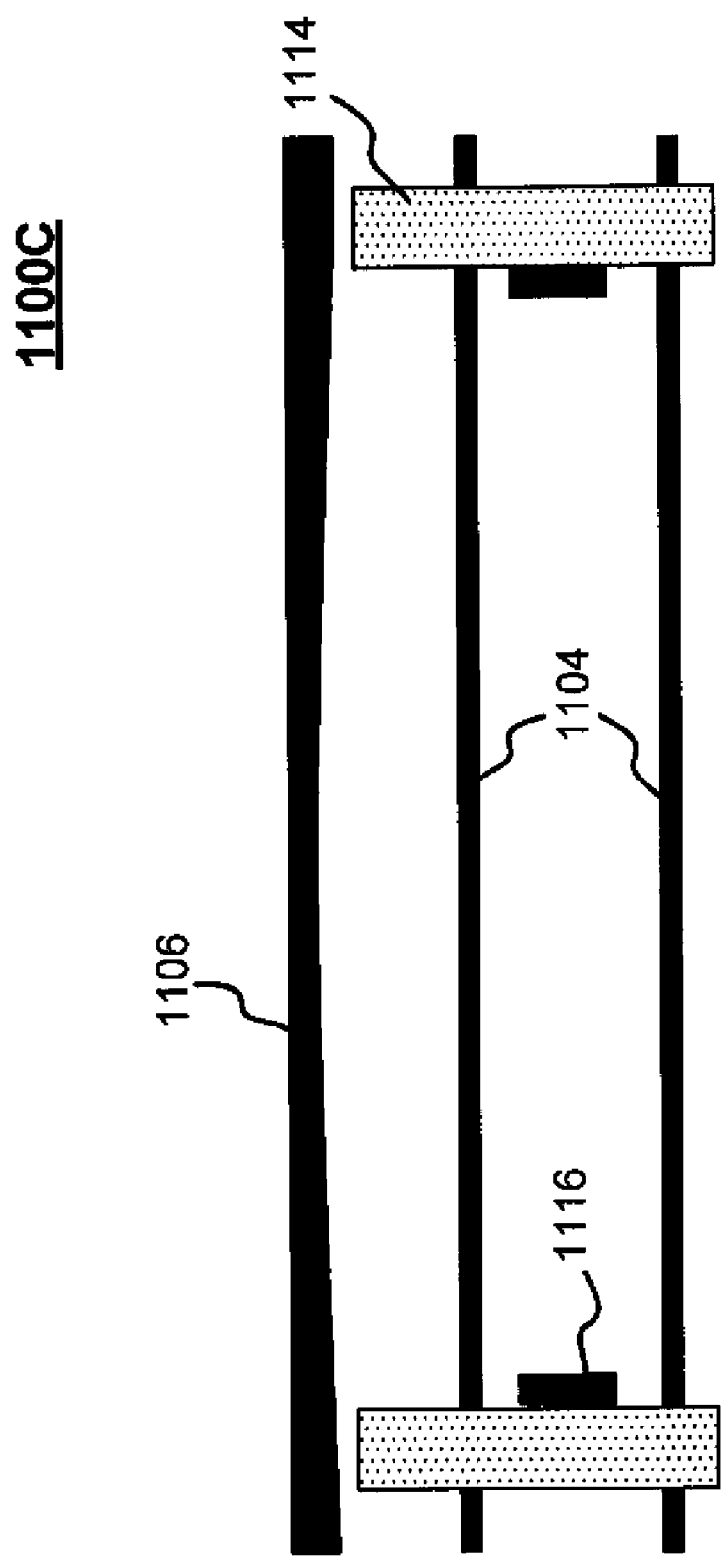
FIG. 11C depicts a top view of a lens configuration using rod-shaped electrodes, a curved end plate, and field termination electrodes in accordance with an embodiment of the present disclosure.

Horizontal focusing may also be achieved in other ways. FIG. 11C, for example, depicts a top view of a lens configuration 1100C using rod-shaped electrodes, a curved end plate, and field termination electrodes in accordance with an embodiment of the present disclosure. Here, a curved end plate (e.g., a curved exit electrode 1106) may provide greater horizontal focusing of an ion beam.

It should be appreciated that the insulating blocks 1114 or bushings may interfere with electrostatic fields near an ion beam if the electrodes 1104 are not sufficiently wide or if the insulating blocks 1114 become charged from an ion beam. Therefore, it may be advantageous to provide a lens configuration where the electrodes 1104 are sufficiently wide to minimize such interfering effects from the insulating blocks or bushings 1114. In order further minimize the effect of the insulating blocks or bushings 1114, one or more field termination electrodes 1116 may be utilized. In some embodiments, these field termination electrodes 1116 may be mounted on the insulating blocks or bushings 1114 at areas of intermediate potentials between the suppression/focusing electrodes 1104 to mitigate any additional effects on the ion beam.

Figure 12B:
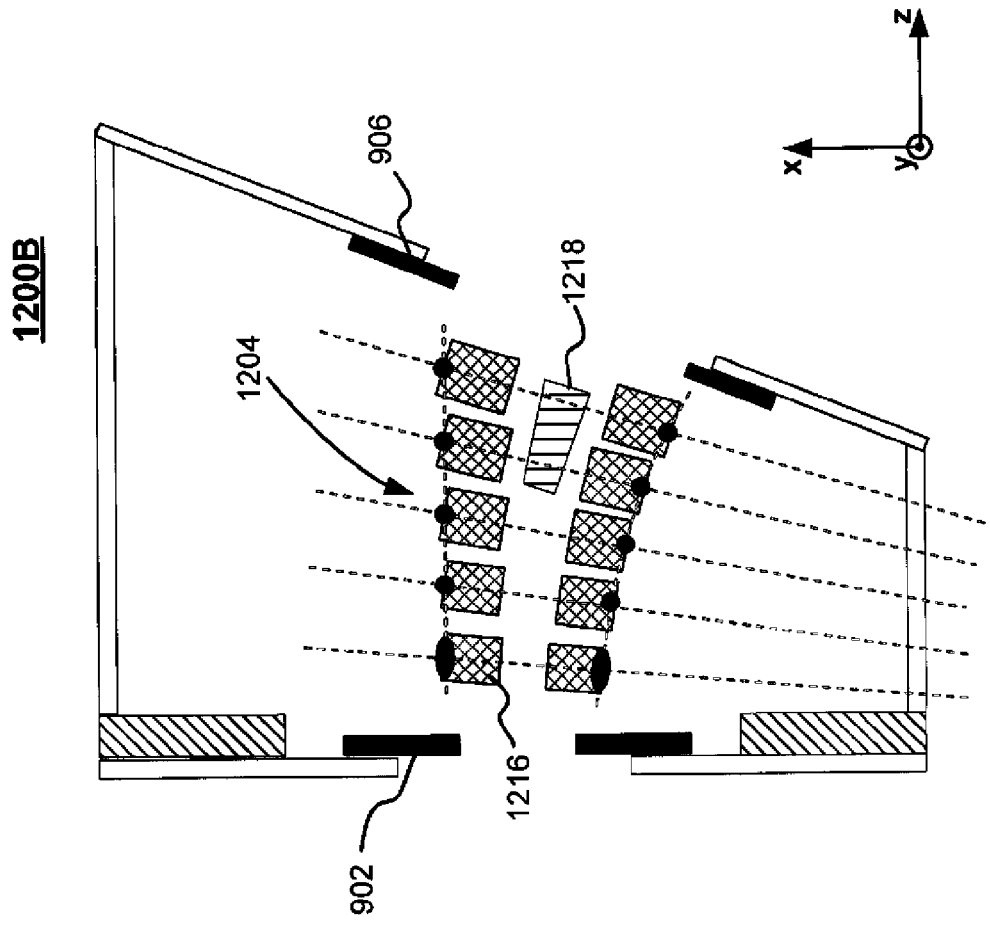
FIG. 12B depicts a side view of a lens configuration using rod-shaped electrodes, field termination electrodes, and side focusing electrodes in accordance with an embodiment of the present disclosure.
Figure 12A:
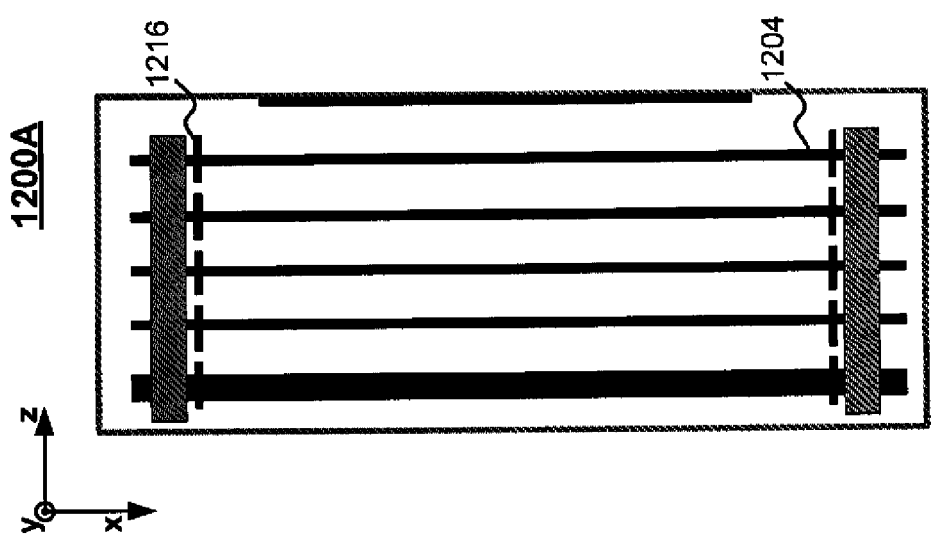
FIG. 12A depicts a top view of a lens configuration using rod-shaped electrodes and field termination electrodes in accordance with an embodiment of the present disclosure.

FIG. 12A depicts a top view of a lens configuration 1200A using rod-shaped electrodes 1204 and field termination electrodes 1216 in accordance with an embodiment of the present disclosure. In this example, one or more field termination electrodes 1216 may be directly or indirectly attached to the rod-shaped electrodes 1204 at their sides to effectively shield effects of nearby components (e.g., mounting blocks or plates).

FIG. 12B depicts a side view of a lens configuration 1200B using rod-shaped electrodes 1204, field termination electrodes 1216, and side-focusing electrodes 1218 in accordance with an embodiment of the present disclosure. In this example, the side-focusing electrodes 1218 may be nominally kept at an average potential between top and bottom rods and may be made more positive to achieve horizontal focusing to counter any space charge of an ion beam.

The field termination electrodes 1216 and the side focusing electrodes 1218 may be made of electrically conductive sheets or other similar material. In some embodiments, these sheets may be connected to one or more electrodes and may also have high resistivity. It should be appreciated that if the resistivity of these sheets is uniform, current flowing through these sheets between electrodes may cause electrostatic potentials to form in the sheets that exactly mirror the electrostatic potentials at a center plane of each lens/electrode. Thus, these sheets may create a similar electromagnetic field (e.g., within a volume of the lens/electrode where the ion beam traverses) as would be created in the event the rod-shaped electrodes 1204 were infinitely long.

It should be appreciated that equations for governing current flow in these sheets may be the same as for electromagnetic fields in a vacuum. For example, a solution to current flow may be expressed by Laplace's equation plus boundary conditions to yield potential electromagnetic fields. Accordingly, potentials on sheets may mimic potentials between two rod-shaped electrodes at a midway point.

Figure 13:
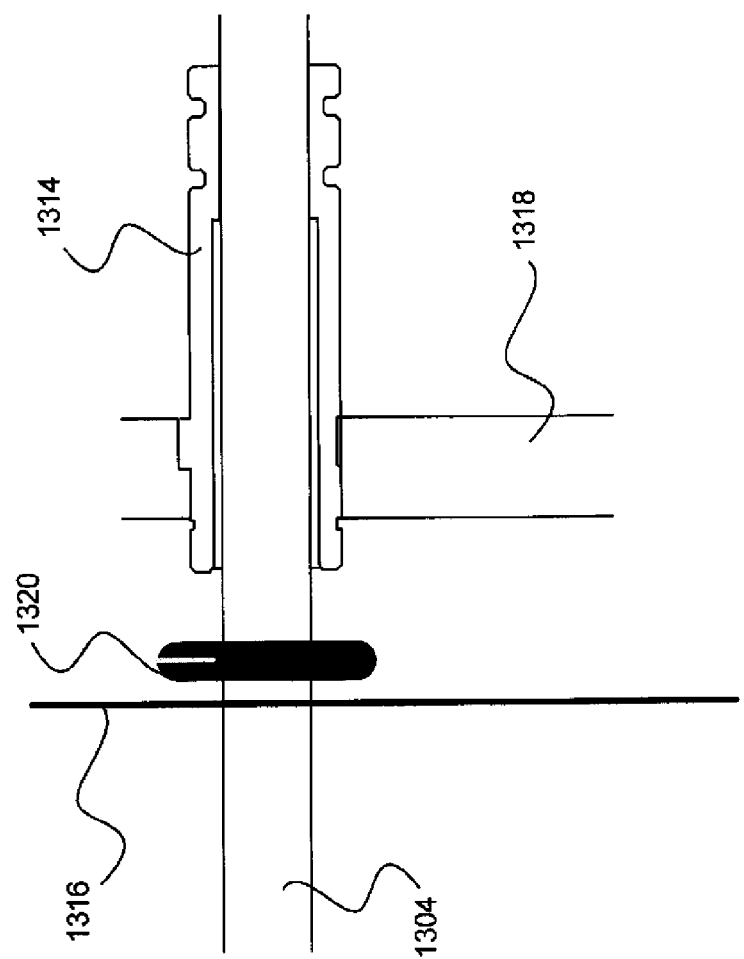
FIG. 13 depicts a side view of a lens configuration using mount bushings for conductive field termination in accordance with an embodiment of the present disclosure.

FIG. 13 depicts a side view of a lens configuration 1300 using mount bushings 1320 for conductive field termination in accordance with an embodiment of the present disclosure. It should be appreciated that one or more mount bushings 1320 may be used to connect a resistive sheet (e.g., field termination electrode 1316) to a rod-shaped electrode 1304. These mount bushings 1320 may be formed of conductive material, such as graphite, glassy carbon, and/or other conductive material. A side focusing electrode 1318 may also be provided, which may be connected to an insulating block 1314 or bushing. In some embodiments, the field termination electrode 1316 may be made of conductive material with high resistivity, such as silicon carbide (SiC) or other similar resistive material (e.g., aluminum). This may help reduce drawing excessive current from high voltage supplies connected to the rod-shaped electrodes 1304. Silicon carbide (SiC) may have a resistivity of less than 1E7 ohm-cm. The insulating block 1314 or bushing may be made of quartz or other similar material. Other various embodiments may also be provided.

An advantage of such a configuration may be that a shape of equipotentials on the side focusing electrodes 1218 may vary or adapt with applied voltages on the rod-shaped electrodes 1204, which may be in contrast to the side termination electrodes 1216 having a fixed geometry.

Embodiments of the present disclosure may provide independent control of deflection, deceleration, and/or focus. Such a technique may also be used to controllably reduce ion beam energy and collimate a diverging ribbon ion beam. By independently and selectively adjusting the electrodes of the various lens configurations described above, variable focusing may be achieved. Not only does this technique provide desired correction to a shape of the ion beam, independently controlled electrodes ultimately provide a parallel ribbon ion beam downstream from the electrostatic lens structure for improved ion implantation.

It should be appreciated that actual voltage potentials applied to the independently biased electrodes may be either computationally determined based on mathematical models, or experimentally determined based on iterative adjustment of biasing voltages and measurement of angle response function(s). Alternatively, the computational and experimental methods may be combined in determining the biasing voltages.

It should be appreciated that electrode shapes (e.g., suppression/focusing electrode shapes) may be non-linear. For example, circular shapes with a particular radius of curvature may be utilized. In this example, the non-linear curvature may be used to correct for second order effects caused by space charge forces or other similar forces.

It should also be appreciated that operation of the electrostatic lens configurations in the embodiments described above should not be restricted to either acceleration or deceleration of an ion beam.

It should be appreciated that while these electrodes may be depicted and described as rod-shaped, other shapes, cross sectional shapes, numbers, and sizes of the electrodes may also be considered.

It should also be appreciated that while embodiments of the present disclosure are directed to an electrostatic lens configuration of seven (7) elements/lenses, other various electrostatic lens configurations may also be provided. For example, electrode lens configurations having smaller or larger numbers of electrodes (e.g., configurations having single, multiple, or segmented electrodes) may also be provided.

It should be also appreciated that while embodiments of the present disclosure are directed to utilizing a independent control of deflection, deceleration, and/or focus in electrostatic lens for ion implantation, other implementations may be provided as well. For example, the disclosed techniques for utilizing a variable electrostatic lens may also apply to other various ion implantation systems that use a combination of electrostatic deceleration and/or magnetic deflection. Other various embodiments may also be provided.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for independently controlling deflection, deceleration, and focus of an ion beam, the apparatus comprising:
   an electrode configuration comprising a set of upper electrodes disposed above an ion beam and a set of lower electrodes disposed below the ion beam;

wherein the set of upper electrodes and the set of lower electrodes are stationary and have fixed positions; and wherein a difference in potentials between the set of upper electrodes and the set of lower electrodes are varied along the central ray trajectory to reflect an energy of the ion beam at each point along the central ray trajectory for independently controlling deflection, deceleration, and focus of an ion beam.

2. The apparatus of claim 1, wherein the set of upper electrodes and the set of lower electrodes are positioned symmetrically about a central ray trajectory of the ion beam.

3. The apparatus of claim 1, wherein the difference in potentials between the set of upper electrodes and the set of lower electrodes divided by a gap between the ion beam, $(V_{upper}(z)-V_{lower}(z))/gap(z)$, is a fixed ratio of the energy of the ion beam, factor$*E_{beam}(z)$, along the central ray trajectory.

4. The apparatus of claim 1, wherein the potentials added for deflection to each pair of upper electrodes and lower electrodes are applied anti-symmetrically above and below the ion beam.

5. The apparatus of claim 1, wherein the potentials added for deflection to each pair of upper electrodes and lower electrodes are applied to only one side of the ion beam with twice the potential.

6. The apparatus of claim 1, wherein the electrode configuration is a graded electrode configuration, such that a gap between the set of upper electrodes and the set of lower electrodes is the same along the central ray trajectory of the ion beam.

7. The apparatus of claim 1, wherein the electrode configuration is a flared electrode configuration, such that a gap between the set of upper electrodes and the set of lower electrodes increases along the central ray trajectory of the ion beam.

8. The apparatus of claim 1, wherein the electrode configuration is a parallel electrode configuration, such that electrodes of the set of upper electrodes are parallel with each other and electrodes of the set of lower electrodes are parallel with each other.

9. The apparatus of claim 1, wherein electrodes of the set of upper electrodes and electrodes of the set of lower electrodes are at least one of electrode plates and rod-shaped electrodes.

10. The apparatus of claim 1, wherein electrodes of the set of upper electrodes and electrodes of the set of lower electrodes are made of at least one of non-contaminating material and a material having a low thermal expansion coefficient.

11. The apparatus of claim 1, wherein electrodes of the set of upper electrodes and electrodes of the set of lower electrodes are curved for horizontal ion beam focusing.

12. The apparatus of claim 1, wherein the electrode configuration further comprises one or more side elements for horizontal beam focusing.

13. The apparatus of claim 12, wherein the one or more side elements are attached to at least one electrode of the set of upper electrodes and the set of lower electrodes and one or more insulating blocks holding the set of upper electrodes and the set of lower electrodes.

14. The apparatus of claim 12, wherein the one or more side elements are held at a different potential than electrodes of the set of upper electrodes and the set of lower electrodes in order to provide additional horizontal beam focus.

15. A method for independently controlling deflection, deceleration, and focus of an ion beam, the method comprising;

providing an electrode configuration comprising a set of upper electrodes disposed above an ion beam and a set of lower electrodes disposed below the ion beam, the set of upper electrodes and the set of lower electrodes being in fixed and stationary positions; and varying a difference in potentials at the set of upper electrodes and the set of lower electrodes along the central ray trajectory to reflect an energy of the ion beam at each point along the central ray trajectory for independently controlling deflection, deceleration, and focus of an ion beam.

16. The method of claim 15, wherein the set of upper electrodes and the set of lower electrodes are positioned symmetrically about a central ray trajectory of the ion beam.

17. The method of claim 15, wherein the difference in potentials between the set of upper electrodes and the set of lower electrodes divided by a gap between the ion beam, $(V_{upper}(z)-V_{lower}(z))/gap(z)$, is a fixed ratio of the energy of the ion beam, factor$*E_{beam}(z)$, along the central ray trajectory.

18. The method of claim 15, wherein the potentials added for deflection to each pair of upper electrodes and lower electrodes are applied anti-symmetrically above and below the ion beam.

19. The method of claim 15, wherein the potentials added for deflection to each pair of upper electrodes and lower electrodes are applied to only one side of the ion beam with twice the potential.

20. The method of claim 15, wherein the electrode configuration is a graded electrode configuration, such that a gap between the set of upper electrodes and the set of lower electrodes is the same along the central ray trajectory of the ion beam.

21. The method of claim 15, wherein the electrode configuration is a flared electrode configuration, such that a gap between the set of upper electrodes and the set of lower electrodes increases along the central ray trajectory of the ion beam.

22. The method of claim 15, wherein the electrode configuration is a parallel electrode configuration, such that electrodes of the set of upper electrodes are parallel with each other and electrodes of the set of lower electrodes are parallel with each other.

23. The method of claim 15, wherein electrodes of the set of upper electrodes and electrodes of the set of lower electrodes are at least one of electrode plates and rod-shaped electrodes.

24. The method of claim 15, wherein electrodes of the set of upper electrodes and electrodes of the set of lower electrodes are made of at least one of non-contaminating material and a material having a low thermal expansion coefficient.

25. The method of claim 15, wherein electrodes of the set of upper electrodes and electrodes of the set of lower electrodes are curved for horizontal ion beam focusing.

26. The method of claim 15, wherein the electrode configuration further comprises one or more side elements for horizontal beam focusing.

27. The method of claim 26, wherein the one or more side elements are attached to at least one electrode of the set of upper electrodes and the set of lower electrodes and one or more insulating blocks holding the set of upper electrodes and the set of lower electrodes.

28. The method of claim 26, wherein the one or more side elements are held at a different potential than electrodes of the set of upper electrodes and the set of lower electrodes in order to provide additional horizontal beam focus.

* * * * *